(12) United States Patent
Ratnakar Aravind et al.

(10) Patent No.: US 7,957,251 B2
(45) Date of Patent: Jun. 7, 2011

(54) SYSTEMS AND METHODS FOR REDUCED LATENCY LOOP RECOVERY

(75) Inventors: Nayak Ratnakar Aravind, Lancaster, PA (US); Richard Rauschmayer, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 206 days.

(21) Appl. No.: 12/371,906

(22) Filed: Feb. 16, 2009

(65) Prior Publication Data
US 2010/0208574 A1  Aug. 19, 2010

(51) Int. Cl.
*G11B 7/00* (2006.01)
(52) U.S. Cl. ............. 369/124.11; 369/59.15; 369/47.28; 369/44.29; 369/44.35
(58) Field of Classification Search ............... 369/124.1, 369/59.15, 47.28, 44.29, 44.35, 124.11
See application file for complete search history.

(56) References Cited

U.S. PATENT DOCUMENTS

| | | | |
|---|---|---|---|
| 4,169,219 A * | 9/1979 | Beard | 369/47.25 |
| 5,262,904 A | 11/1993 | Tang et al. | |
| 5,357,520 A | 10/1994 | Arnett et al. | |
| 5,416,759 A * | 5/1995 | Chun | 369/44.36 |
| 5,493,454 A | 2/1996 | Ziperovich et al. | |
| 5,517,146 A | 5/1996 | Yamasaki | |
| 5,583,705 A | 12/1996 | Ziperovich et al. | |
| 5,740,141 A * | 4/1998 | Sano et al. | 369/59.15 |
| 5,781,358 A | 7/1998 | Hasegawa | |
| 5,986,830 A | 11/1999 | Hein | |
| 5,999,355 A | 12/1999 | Behrens et al. | |
| 6,018,373 A * | 1/2000 | Hanai | 348/630 |
| 6,043,942 A | 3/2000 | Cunningham et al. | |
| 6,091,560 A | 7/2000 | Du | |
| 6,134,691 A | 10/2000 | Hirasaka | |
| 6,141,168 A | 10/2000 | Takahashi et al. | |
| 6,147,828 A | 11/2000 | Bloodworth et al. | |
| 6,181,505 B1 | 1/2001 | Sacks et al. | |
| 6,208,481 B1 | 3/2001 | Spurbeck et al. | |

(Continued)

FOREIGN PATENT DOCUMENTS

GB  2 320 866  6/1997

OTHER PUBLICATIONS

U.S. Appl. No. 12/199,325, filed Aug. 27, 2008, Mathew.

(Continued)

*Primary Examiner* — Wayne R Young
*Assistant Examiner* — Linh T Nguyen
(74) *Attorney, Agent, or Firm* — Hamilton, DeSanctis & Cha (57) ABSTRACT

Various embodiments of the present invention provide systems and methods for reduced latency feedback in a data processing system. For example, some embodiments provide a data processing system that includes a variable gain amplifier, a processing circuit, a data detector, and an error signal calculation circuit. The variable gain amplifier amplifies a data input signal and provides an amplified signal. The processing circuit generates a signal output corresponding to the amplified signal, and includes a conditional multiplication circuit. The conditional multiplication circuit conditionally multiplies the signal output by a gain correction signal and provides the result as an interim output. The data detector applies a data detection algorithm to the signal output and provides an ideal output. The error signal calculation circuit generates a gain correction signal based at least in part on the interim output and a derivative of the ideal output. The level of amplification by the variable gain amplifier is based at least in part on the gain correction signal.

23 Claims, 4 Drawing Sheets

U.S. PATENT DOCUMENTS

| | | |
|---|---|---|
| 6,212,024 B1 | 4/2001 | Igarashi et al. |
| 6,243,031 B1 | 6/2001 | Jusuf et al. |
| 6,246,723 B1 | 6/2001 | Bliss et al. |
| 6,337,778 B1 | 1/2002 | Gagne |
| 6,396,651 B1 | 5/2002 | Grover |
| 6,404,572 B1 | 6/2002 | Hong |
| 6,535,345 B1 | 3/2003 | Shimoda |
| 6,563,655 B1 | 5/2003 | Yamasaki et al. |
| 6,621,648 B2 | 9/2003 | Elliott et al. |
| 6,662,303 B1 | 12/2003 | Toosky et al. |
| 6,671,244 B2 | 12/2003 | Honma |
| 6,674,590 B2 | 1/2004 | Ottesen et al. |
| 6,678,230 B2 | 1/2004 | Miyashita et al. |
| 6,721,114 B1 | 4/2004 | Sutardja et al. |
| 6,788,481 B2 | 9/2004 | Fang et al. |
| 6,894,854 B1 | 5/2005 | Carlson et al. |
| 6,934,100 B2 | 8/2005 | Ueno |
| 6,992,961 B2 * | 1/2006 | Minase et al. ............ 369/53.23 |
| 7,012,772 B1 | 3/2006 | Vis |
| 7,079,342 B1 | 7/2006 | Han et al. |
| 7,092,179 B2 | 8/2006 | Yamanouchi |
| 7,123,429 B2 | 10/2006 | Musungu et al. |
| 7,126,773 B1 | 10/2006 | Taratorin |
| 7,193,802 B2 | 3/2007 | Cideciyan et al. |
| 7,248,424 B2 | 7/2007 | Ueno |
| 7,256,954 B2 | 8/2007 | Serizawa et al. |
| 7,262,928 B1 | 8/2007 | Oberg |
| 7,271,753 B1 | 9/2007 | Padukone et al. |
| 7,308,057 B1 | 12/2007 | Patapoutian |
| 7,440,224 B2 | 10/2008 | Ehrlich et al. |
| 7,453,775 B2 * | 11/2008 | Liang et al. ................ 369/47.27 |
| 7,495,854 B2 | 2/2009 | Hutchins |
| 7,542,227 B2 | 6/2009 | Che et al. |
| 7,715,135 B1 | 5/2010 | Sutardja et al. |
| 2002/0159350 A1 | 10/2002 | Ogura et al. |
| 2003/0026354 A1 | 2/2003 | Chang et al. |
| 2003/0048564 A1 | 3/2003 | Koller et al. |
| 2005/0117243 A1 | 6/2005 | Serizawa |
| 2006/0061496 A1 | 3/2006 | Stein et al. |
| 2006/0062125 A1 | 3/2006 | Horie et al. |
| 2006/0176947 A1 | 8/2006 | Lim |
| 2007/0041115 A1 | 2/2007 | Lee |
| 2007/0047120 A1 | 3/2007 | DeGroat |
| 2007/0076313 A1 | 4/2007 | Hutchins et al. |
| 2007/0140088 A1 | 6/2007 | Hino et al. |
| 2007/0280079 A1 * | 12/2007 | Cheng et al. .................. 369/59.1 |
| 2008/0025167 A1 * | 1/2008 | Wu ............................ 369/44.35 |
| 2008/0031114 A1 | 2/2008 | Hong et al. |
| 2008/0037153 A1 | 2/2008 | Yoshizawa |
| 2008/0081382 A1 | 4/2008 | Yang et al. |
| 2009/0016245 A1 | 1/2009 | Karls |
| 2009/0033680 A1 | 2/2009 | Lee et al. |
| 2009/0230639 A1 | 9/2009 | Van Cayzeele |

OTHER PUBLICATIONS

U.S. Appl. No. 12/273,265, filed Nov. 18, 2008, Mathew.
U.S. Appl. No. 12/337,775, filed Dec. 18, 2008, Mathew.
U.S. Appl. No. 12/337,805, filed Dec. 18, 2008, Mueller.
U.S. Appl. No. 12/337,828, filed Dec. 18, 2008, Mueller.
U.S. Appl. No. 12/337,850, filed Dec. 18, 2008, Mueller.
U.S. Appl. No. 12/352,540, filed Jan. 12, 2009, Liu.
Cho and Lee, "An Estimation Technique for Nonlinear Distortion in High Density Magnetic Recording Channels", IEEE Transactions on Magnetics, vol. 34, No. 1, pp. 40-44 Jan. 1998.
Degroat et al., "Experimental Characterization of Media Noise Based on Equalized Synchronized Drive Data", IEEE Trans. Magnetics, vol. 37, No. 2, pp. 633-638, Mar. 2001.
Farhang-Boroujeny, Adaptive Filters: Theory and Applications. John Wiley & Sons Ltd, 1998, Chapter 11. pp. 373-379.
Kavcic and Patapoutian, "A Signal-Dependent Autoregressive Channel Model", IEEE Trans. Magnetics, vol. 35 No. 5, pp. 2316-2318, Sep. 1999.
Lin et al. "An estimation technique for accurately modelling the magnetic recording channel including nonlinearities." IEEE Trans. Mag, vol. 25, No. 5, pp. 4084-4086, Sep. 1989.
Moon, J., "Signal-to-Noise Ratio Definition for Magnetic Recording Channels With Transition Noise", IEEE Trans. Magnetics, vol. 36, No. 5, pp. 3881-3883, Sep. 2000.
Palmer et al, "Identification of nonlinear write effects using pseudorandom sequences" IEEE Trans. Magnetics, vol. 23 No. 5, pp. 2377-2379, Sep. 1987.
Partovi; et al., "Flow-Through Latch and Edge-Triggered Flip-Flop Hybrid Elements"; Feb. 8, 1996; pp. 138-139; Solid-State Circuits Conf Digest of Technical Papers IEEE.
Tokumasu et al. "A New Reduced Clock-Swing Flip-Flop (NDKFF)," Corporate Research & Development Center, Toshiba Corporation. IEEE Feb. 2002 Custom Intergrated Circuits Conf.
Wood and Donaldson, "The Helical-Scan Magnetic Tape Recorder as a Digital Communication Channel", IEEE Transactions on Magnetics, vol. MAG-15, No. 2, pp. 935-943 Mar. 1979.

* cited by examiner

SYSTEMS AND METHODS FOR REDUCED LATENCY LOOP RECOVERY

BACKGROUND OF THE INVENTION

The present inventions are related to systems and methods for transferring information, and more particularly to systems and methods for transferring information from a storage medium.

A typical data processing system receives an analog input signal that is amplified using a variable gain amplifier that amplifies the input signal. The amplified signal is converted to a digital signal and processed using one of a variety of digital processing techniques. Feedback from the digital processing is provided back to the variable gain amplifier to adjust the applied gain. As bit periods have decreased, faster and faster data processing has been developed. Because of this, the feedback latency has grown in terms of the number of bit periods. This latency negatively effects loop stability.

Figure 1:
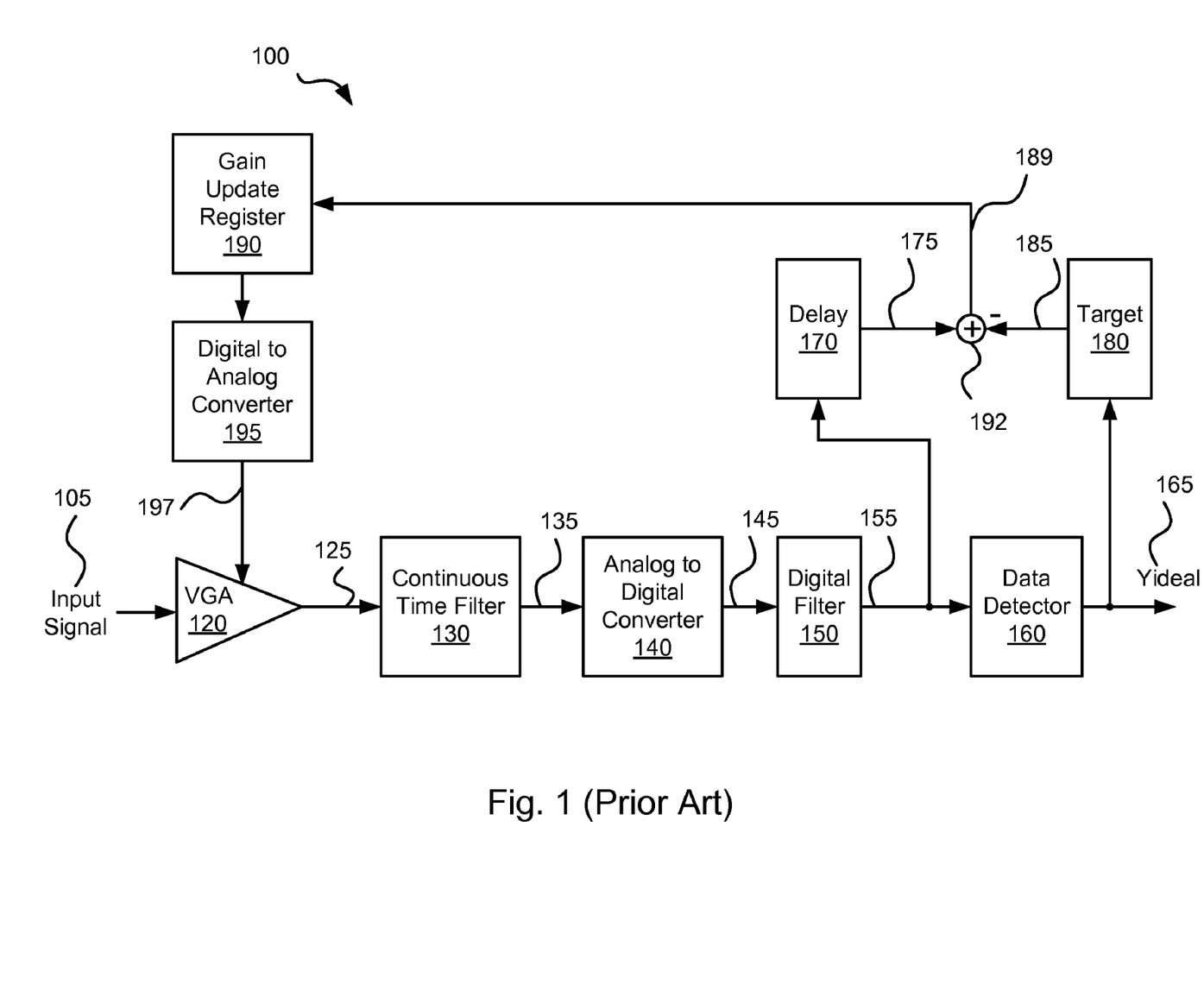
FIG. 1 depicts a data detection system including a prior art gain feedback loop.

Turning to FIG. 1, a data detection system 100 including a prior art gain feedback loop is shown. Data detection system 100 includes a variable gain amplifier 120 that receives an analog input signal 105, and provides an amplified output 125. Amplified output 125 is filtered using a continuous time filter 130, and a resulting filtered output 135 is provided to an analog to digital converter 140. Analog to digital converter 140 provides a series of digital samples 145 corresponding to filtered output 135. The series of digital samples 145 are provided to a digital filter 150 that provides a digitally filtered output 155. A data detection algorithm is applied by a data detector 160 to digitally filtered output 155 to recover a Yideal output 165.

Yideal output 165 is provided to a partial response target filter 180 that conforms Yideal to a partial response target and provides a target output 185. Digitally filtered output 155 is provided to a delay circuit 170 that provides a delayed signal 175 that corresponds to digitally filtered output 155 delayed in time sufficient to align it with target output 185. A summation element 192 subtracts target output 185 from delayed signal 175, and provides the result as an error signal 189. Error signal 189 is stored to a gain update register 190. The output of gain update register 190 is converted to an analog feedback signal 197 using a digital to analog converter 195. Analog feedback signal 197 is provided to variable gain amplifier 120 where it is used to adjust the gain applied to analog input signal 105.

There can be a substantial latency between the time that variable gain amplifier 120 provides amplified output 125 and when analog feedback signal 197 corresponding to amplified output 125 is available. As this latency grows to several bit periods, it can result in substantial loop instability as analog feedback signal 197 can be applied well after the condition it was intended to correct has resolved itself. Indeed, in some cases, analog feedback signal 197, rather than operating as a negative feedback may operate as a positive feedback accentuate an undesired operational condition.

Hence, for at least the aforementioned reasons, there exists a need in the art for advanced systems and methods for reduced latency data processing.

BRIEF SUMMARY OF THE INVENTION

The present inventions are related to systems and methods for transferring information, and more particularly to systems and methods for transferring information from a storage medium.

Various embodiments of the present invention provide a data processing system that includes a variable gain amplifier, a processing circuit, a data detector, and an error signal calculation circuit. The variable gain amplifier amplifies a data input signal and provides an amplified signal. The processing circuit generates a signal output corresponding to the amplified signal, and includes a conditional multiplication circuit. The conditional multiplication circuit conditionally multiplies the signal output by a gain correction signal and provides the result as an interim output. The data detector applies a data detection algorithm to the signal output and provides an ideal output. The error signal calculation circuit generates a gain correction signal based at least in part on the interim output and a derivative of the ideal output. In some cases, the derivative of the ideal output is the ideal output. The level of amplification by the variable gain amplifier is based at least in part on the gain correction signal.

In some instances of the aforementioned embodiments, the conditional multiplication circuit is operable to provide the signal output as the interim output after a delay period, and to provide the product of multiplying the signal output by the gain correction signal as the interim output prior to expiration of the delay period. In various cases, the delay period corresponds approximately to a propagation delay of the amplified signal to the error signal calculation circuit. In particular instances of the aforementioned embodiments, the conditional multiplication circuit includes a delay circuit and an inverse function circuit, a first multiplier circuit, and a second multiplier circuit. The inverse function circuit provides an inverse of the gain correction signal, and the combination of the delay circuit and the inverse function circuit provides a delayed inverse of the gain correction signal. The first multiplier circuit multiplies the gain correction signal by the delayed inverse of the gain correction signal to yield a product, and the second multiplier circuit multiplies the product by the signal output to yield the interim output. In other cases, the delay period imposed by the delay circuit corresponds approximately to a propagation delay of the amplified signal to the error signal calculation circuit.

In one or more instances of the aforementioned embodiments, the error calculation circuit includes a summation element, and wherein the summation element subtracts a derivative of the ideal output from the interim output to yield an error signal corresponding to the gain correction signal. In various instances of the aforementioned embodiment, the signal output is a first signal output, and the processing circuit further includes: an analog to digital converter, a digital filter and a delay circuit. The analog to digital converter converts the amplified signal to a series of digital samples. The digital filter filters to series of digital samples to yield a second signal output. The delay circuit delays the second signal output by a delay period to yield the first signal output. In some such instances, the systems further include a partial response target filter that receives the ideal output and provides the derivative of the ideal output. In particular cases, the delay period corresponds approximately to a propagation delay of the first signal output to the derivative of the ideal output, less the propagation delay through the conditional multiplication circuit. In various instances, two delay circuits are utilized. The first provides a delay period corresponding approximately to a propagation delay of the first signal output to the derivative of the ideal output, less the propagation delay through the conditional multiplication circuit. The second delay circuit is implemented in relation to an inverse function circuit. The inverse function circuit provides an inverse of the gain correction signal. The combination of the second delay circuit and the inverse function circuit provides a delayed inverse of the gain correction signal, and the delay imposed by the second delay circuit corresponds approximately to a propagation delay of the amplified signal to the error signal calculation circuit. A first multiplier circuit multiplies the gain correction signal by the delayed inverse of the gain correction signal to yield a product; and a second multiplier circuit multiplies the product by the signal output to yield the interim output.

Other embodiments of the present invention provide methods for reduced latency data processing. Such methods include providing a variable gain amplifier, and amplifying a data input signal using the variable gain amplifier to provide an amplified signal. The methods further include: processing the amplified signal to create a processed signal; conditionally multiplying the processed signal by a gain correction signal to yield an interim signal; performing a data detection on the processed signal to create an ideal output; calculating a difference between the interim signal and the ideal output; generating the gain correction signal based at least in part on the difference; and adjusting an amplification level of the variable gain amplifier based at least in part on the gain correction signal.

In some cases of the aforementioned embodiments, processing the amplified signal includes: converting the amplified signal to a digital amplified signal, and digitally filtering the digital amplified signal to generate the processed signal. In various instances of the aforementioned embodiments, performing the data detection on the processed signal includes: applying a data detection algorithm to the processed signal to yield a detected output; and performing a partial target response filtering on the detected output to yield the ideal output.

In one or more instances of the aforementioned embodiments, conditionally multiplying the processed signal by the gain correction signal yields an interim signal that is the processed signal multiplied by the gain correction signal for a period before the gain correction signal has been applied to a subsequent data input signal. For a period occurring after application of the gain correction signal to a subsequent data input signal, the processed signal is provided as the interim signal. In other instances of the aforementioned embodiments, conditionally multiplying the processed signal by the gain correction signal yields an interim signal that is the processed signal multiplied by the gain correction signal for a first period after the gain correction signal is generated and before a delay point, and is the processed signal for a period after the delay point. In yet other instances of the aforementioned embodiments, conditionally multiplying the processed signal by the gain correction signal yields an interim signal that is the processed signal multiplied by the gain correction signal for a first period, and is the processed signal for a second period. The first period corresponds approximately to the time delay between generation of the gain correction signal to propagation of the gain correction signal into the difference, and the second period is after the first period. In some cases, the second period continues from the end of the first period to generation of a subsequent gain correction signal.

Yet other embodiments of the present invention provide storage devices. Such storage devices include a storage medium, and a read/write head assembly disposed in relation to the storage medium. In addition, such storage devices include a variable gain amplifier, a processing circuit, a data detector, and an error signal calculation circuit. The variable gain amplifier amplifies a data input signal and provides an amplified signal. The processing circuit generates a signal output corresponding to the amplified signal, and includes a conditional multiplication circuit. The conditional multiplication circuit conditionally multiplies the signal output by a gain correction signal and provides the result as an interim output. The data detector applies a data detection algorithm to the signal output and provides an ideal output. The error signal calculation circuit generates a gain correction signal based at least in part on the interim output and a derivative of the ideal output. In some cases, the derivative of the ideal output is the ideal output. The level of amplification by the variable gain amplifier is based at least in part on the gain correction signal.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for transferring information from a storage medium.

Figure 2:
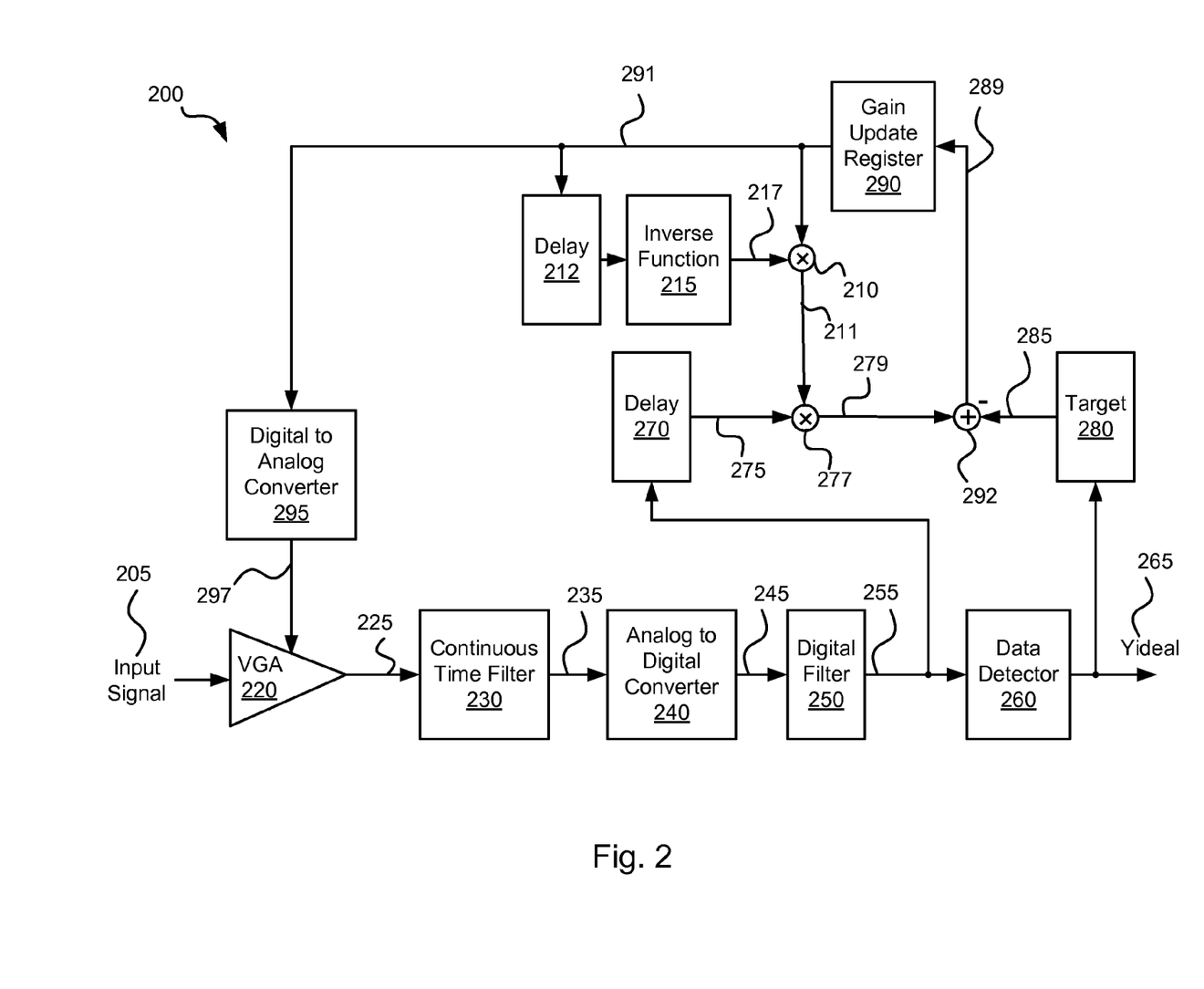
FIG. 2 shows a data detection system including a reduced latency gain feedback loop in accordance with various embodiments of the present invention.

Turning to FIG. 2, a data detection system 200 including a reduced latency gain feedback loop is shown in accordance with various embodiments of the present invention. Data detection system 200 includes a variable gain amplifier 220 that receives an analog input signal 205, and provides a variably amplified output 225. The amplification applied to analog input signal 205 is governed at least in part by an analog feedback signal 297. Variable gain amplifier 220 may be any amplifier known in the art that is capable of providing an amplified output that varies in amplitude based upon a feedback signal. Based upon the disclosure provided herein, one of ordinary skill in the art will recognize a variety of variable gain amplifiers that may be used in relation to different embodiments of the present invention. Where, for example, data detection system 200 is used to process data receives from a storage medium, analog input signal 205 is derived from a read/write head assembly (not shown) that is disposed in relation to the magnetic storage medium (not shown).

Based upon the disclosure provided herein, one of ordinary skill in the art will recognize a variety of sources for analog input signal 205.

Variably amplified output 225 is filtered using a continuous time filter 230. In some cases, continuous time filter 230 is an RC filter circuit as is known in the art that is tuned to operate as a band pass filter, a high pass filter, or a low pass filter. Based upon the disclosure provided herein, one of ordinary skill in the art will recognize a variety of filters that may be used as continuous time filter 230. It should also be noted that other analog processing circuits may be included with continuous time filter 230 depending upon the particular operation of the circuit. For example, a magneto-resistive compensation circuit (not shown) as are known in the art may be used, where applicable, to compensate for non-linear noise introduced by an upstream read/write head assembly (not shown). Based upon the disclosure provided herein, one of ordinary skill in the art will recognize a variety of analog processing circuitry that may be incorporated in data detection system 200.

A filtered output 235 is provided from continuous time filter 230 to an analog to digital converter 240. Analog to digital converter 240 may be any circuit known in the art that is capable of converting an analog input signal to a series of digital samples corresponding thereto. Analog to digital converter 240 samples filtered output 235 and provides a series of digital samples 245 corresponding to the magnitude of filtered output 235 at respective sampling points. Digital samples 245 are provided to a digital filter 250. Digital filter 250 provides a digitally filtered output 255. In some embodiments of the present invention, digital filter 250 is a digital finite impulse response filter as are known in the art. In one particular embodiment of the present invention, digital filter 250 is a ten tap digital finite impulse response filter.

Digitally filtered output 255 is provided to a data detector circuit 260. Data detector circuit 260 may be any detector/decoder known in the art. For example, data detector circuit 260 may incorporate a low density parity check decoder. As another example, data detector circuit 260 may incorporate a Viterbi algorithm decoder. Based upon the disclosure provided herein, one of ordinary skill in the art will recognize various detector circuits that may be used in relation to different embodiments of the present invention. Using digitally filtered output 255, data detector circuit 260 generates a Yideal output 265. Yideal output 265 represents signal input 205 with various error corrections applied by the data detection process. Yideal output 265 is made available for downstream processing.

In addition, Yideal output 265 is provided to a partial response target circuit 280 that conforms the output to a known target. Partial response target circuit 280 may be any target filter known in the art. In some embodiments of the present invention, partial response target circuit is a digital finite impulse response filter as are known in the art. In one particular embodiment of the present invention, partial response target circuit 280 is a three tap digital finite impulse response filter.

Partial response target circuit 280 provides a target output 285 to a summation element 292. Summation element 292 subtracts target output 285 from an adjusted output 279, and the result is provided as an error signal 289 that is stored to a gain update register 290. As discussed below, adjusted output 279 is derived from digitally filtered output 255. A gain correction output 291 is provided from gain update register 290. Gain correction output 291 is converted to analog feedback signal 297 using a digital to analog converter 295. Analog feedback signal 297 is provided to variable gain amplifier 220 where it is used to adjust the gain applied to analog input signal 205.

The latency between the time that variable gain amplifier 220 provides variably amplified output 225 and when analog feedback signal 297 corresponding to variably amplified output 225 is available is reduced by applying an interim correction. The interim correction is achieved by feeding gain correction output 291 into the calculation of error signal 289 without waiting for the gain adjustment to propagate back through the loop via variable gain amplifier 220. As an overview, the interim correction effectively multiplies digitally filtered output 255 by gain correction factor 291 before being compared with target output 285. As such, any gain adjustment corresponding to error signal 289 is quickly available for calculating a new value of error signal 289. This results in a reduction in latency between the availability of variably amplified signal 225 and the application of signals derived there from to error signal 289 (and thus gain correction output 291). As just some advantages, such a reduction in latency increases loop stability and allows for decreased bit periods along with correspondingly higher bandwidth through data detection system 200.

In particular, gain correction output 291 is provided to a delay circuit 212. The output of delay circuit 212 is provided to an inverse function circuit 215 that provides an inverted output 217. Delay circuit 212 applies a delay to the gain correction output 291 that accounts for the time that it takes for gain correction output 291 to be reflected in error signal 289 via the path through variable gain amplifier 220 (i.e., gain correction output 291 to digital to analog converter 295, continuous time filter 230, analog to digital converter 240, digital filter 250, data detector 260, partial response target circuit 280 and summation element 292). This loop is referred to herein as the slave loop. Inverted output 217 is provided to a multiplier circuit 210 that multiplies inverted output 217 by gain correction output 291. A product output 211 from multiplier circuit 210 is provided to a multiplier circuit 277 that provides adjusted output 279. The loop from error signal 289 through gain update register 290, delay circuit 212, inverse function 215, multiplier 210, multiplier 277 and summation element 292 is referred to herein as a master loop.

Product output 211 initially reflects the value of gain correction output 291, but after the expiration of the delay period imposed by delay circuit 212, product output 211 is unity as gain correction output 291 is multiplied by the inverse thereof. The following pseudo-code describes the value of product output 211:

```
If (t < T+delay period of Delay Circuit 212){
        Product Output 211 = Gain Correction Output 291
}
Else If (t >= T+delay period of Delay Circuit 212){
        Product Output 211 = 1.
}
```

In this way, any gain reflected by gain correction output 291 can be applied very quickly to the generation of error signal 289 as part of the master loop, but the gain reflected by gain correction output 291 that is applied to the slower slave loop can be cancelled when it is applied to error signal 289. This prevents double counting of gain correction output 291, while at the same time allowing for an interim use of gain correction output 291. In effect, gain correction output 291 is accelerated into error signal 289 via the master loop for the initial period where gain correction output is still propagating through the slave loop, and then the actual affect of gain correction output 291 on variable gain amplifier 220 is applied after it is propagated through the slave loop.

Digitally filtered output 255 is provided to a delay circuit 270 that provides a delayed filtered output signal 275. The period of delay imposed by delay circuit 270 corresponds to the time required for a signal to propagate through data detector 260 and partial response target circuit 280, less the amount of time required to propagate through multiplier 277. By imposing this delay, adjusted output 279 is aligned in time with target output 285 (i.e., a corresponding digitally filtered output 255 is used to create both target output 285 and adjusted output 279.

In operation, the master loop provides an estimate of an appropriate gain adjustment. The slave loop follows the master loop, and refines the estimated gain adjustment to include the actual effect of gin through variable gain amplifier 220. Use of such a master loop and slave loop provides good loop stability, while assuring that the variable gain amplifier applies an appropriate amplification used for reducing any energy due to error terms in analog input signal 205.

Figure 3:
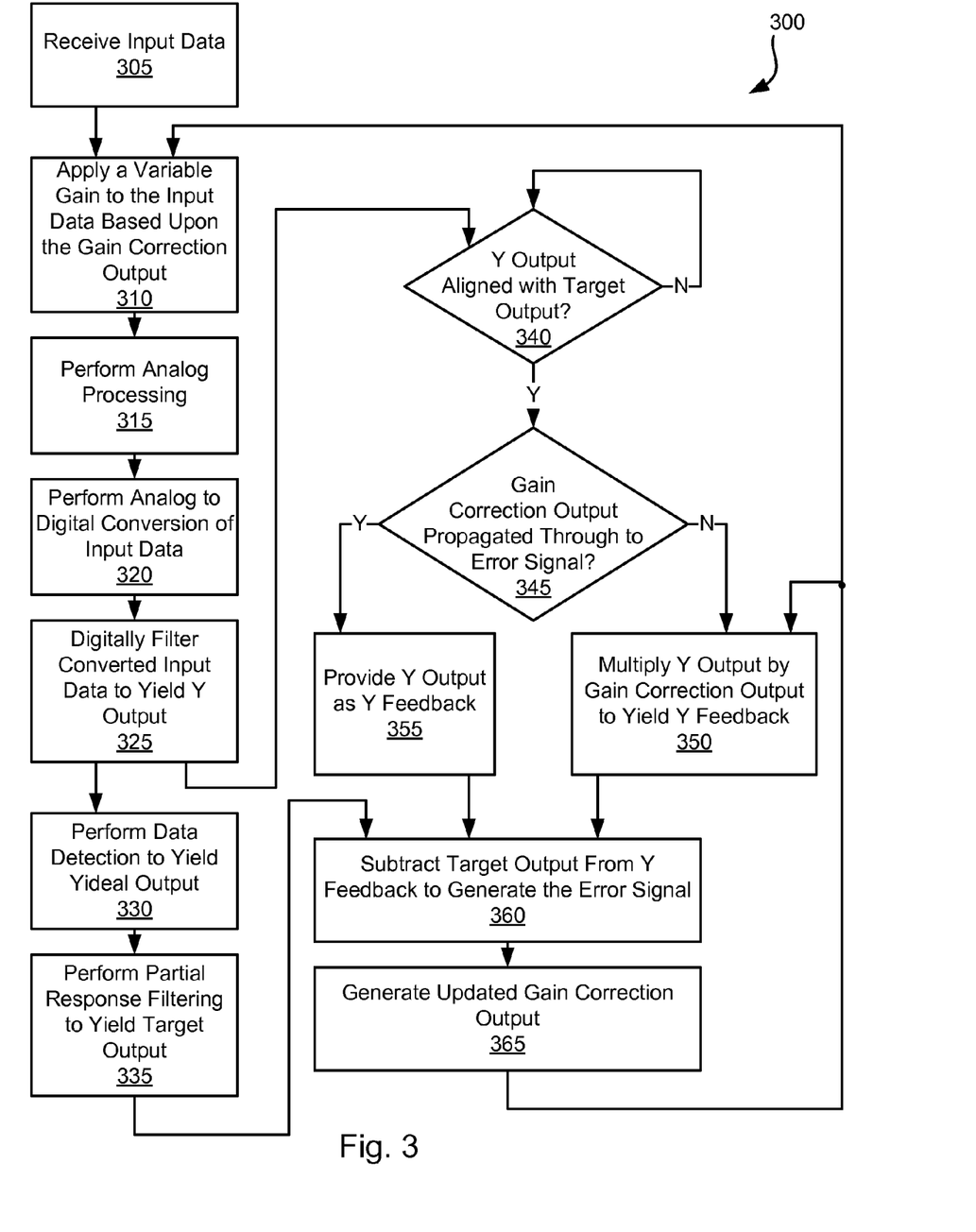
FIG. 3 is a flow diagram showing a method for reducing gain feedback latency in a data detection system in accordance with one or more embodiments of the present invention.

Turning to FIG. 3, a flow diagram 300 shows a method for reducing gain feedback latency in a data detection system in accordance with one or more embodiments of the present invention. Following flow diagram 300, a data input is received (block 305). This data input may be, for example, an analog input signal derived from a magnetic storage medium. A variable amplification is performed on the data input based at least in part on a gain correction output that is calculated using the method (block 310). In some cases, the variable amplification is done using an analog variable gain amplifier. In such cases, the gain correction output may be an analog signal provided as an input to the variable gain amplifier. A variety of analog processing may be performed on the variably amplified data input (block 315). This analog processing may include, but is not limited to, a continuous time filtering process. The processed signal is then converted to one or more digital samples through an analog to digital conversion process (block 320).

The resulting digital samples are digitally filtered to yield a Y output (block 325). In some cases, the digital filtering is done using a digital finite impulse response filter as are known in the art. A data detection process is performed on the Y output to generate a Yideal output (block 330). The data detection process may be performed using any data detector/decoder known in the art. In addition, a partial response filtering is applied to the Yideal output to yield a target output (block 335). In some cases, the partial response filtering is done using a digital finite impulse response filter where the taps of the filter are coupled to a target set as is known in the art.

The Y output is delayed in time to align it with the target output (block 340). Once the Y output aligns with the target output (or will align after a multiplication process) (block 340), it is determined whether the current gain correction output has propagated through the variable gain amplification process and back through to the generation of a feedback error signal (block 345). Where the current gain correction output has not yet propagated back through the variable gain amplification process to the generation of the feedback error signal (block 345), the Y output is multiplied by the current gain correction output to yield a Y feedback signal (block 350). Otherwise, where the current gain correction output has propagated back through the variable gain amplification process to the generation of the feedback error signal (block 345), the Y output is passed through as the Y feedback signal (block 355). In both cases, the target output (from block 335) is subtracted from the Y feedback signal to generate the feedback error signal (block 360). This feedback error signal is then used to generate an updated gain correction output (block 365).

Figure 4:
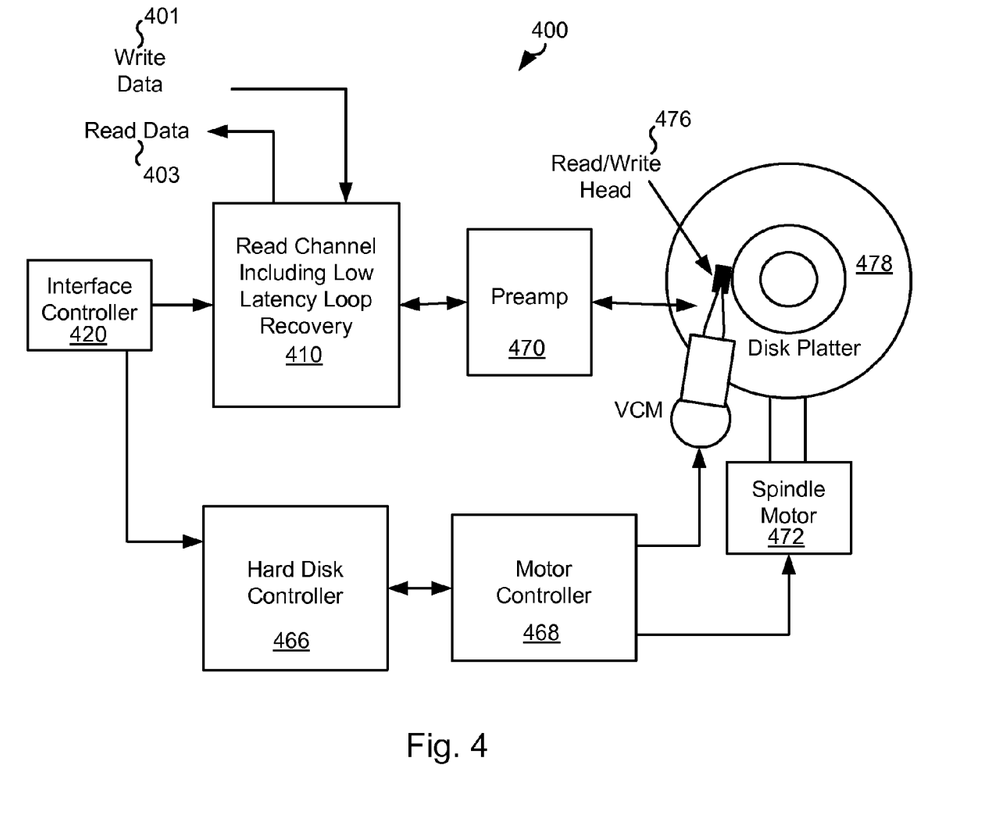
FIG. 4 depicts a storage system including a reduced latency gain feedback loop in accordance with various embodiments of the present invention.

Turning to FIG. 4, a storage system 400 including a read channel 410 with low latency loop recovery is shown in accordance with various embodiments of the present invention. Storage system 400 may be, for example, a hard disk drive. The low latency loop recovery includes a data detector that may be any data detector known in the art including, for example, a Viterbi algorithm data detector. Storage system 400 also includes a preamplifier 470, an interface controller 420, a hard disk controller 466, a motor controller 468, a spindle motor 472, a disk platter 478, and a read/write head 476. Interface controller 420 controls addressing and timing of data to/from disk platter 478. The data on disk platter 478 consists of groups of magnetic signals that may be detected by read/write head assembly 476 when the assembly is properly positioned over disk platter 478. In one embodiment, disk platter 478 includes magnetic signals recorded in accordance with either a longitudinal or a perpendicular recording scheme.

In a typical read operation, read/write head assembly 476 is accurately positioned by motor controller 468 over a desired data track on disk platter 478. Motor controller 468 both positions read/write head assembly 476 in relation to disk platter 478 and drives spindle motor 472 by moving read/write head assembly to the proper data track on disk platter 478 under the direction of hard disk controller 466. Spindle motor 472 spins disk platter 478 at a determined spin rate (RPMs). Once read/write head assembly 478 is positioned adjacent the proper data track, magnetic signals representing data on disk platter 478 are sensed by read/write head assembly 476 as disk platter 478 is rotated by spindle motor 472. The sensed magnetic signals are provided as a continuous, minute analog signal representative of the magnetic data on disk platter 478. This minute analog signal is transferred from read/write head assembly 476 to read channel module 464 via preamplifier 470. Preamplifier 470 is operable to amplify the minute analog signals accessed from disk platter 478. In turn, read channel module 410 decodes and digitizes the received analog signal to recreate the information originally written to disk platter 478. This data is provided as read data 403 to a receiving circuit. As part of decoding the received information, read channel 410 performs a variable gain amplification based on a gain adjustment feedback circuit. The gain adjustment feedback circuit includes both a master loop and a slave loop. In some cases, read channel 410 includes circuitry similar to that discussed above in relation to FIG. 2. In some cases, gain adjustment process is performed in accordance with that discussed above in relation to FIG. 3. A write operation is substantially the opposite of the preceding read operation with write data 401 being provided to read channel module 410. This data is then encoded and written to disk platter 478.

In conclusion, the invention provides novel systems, devices, methods and arrangements for reducing loop latency. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
 a variable gain amplifier operable to amplify a data input signal and to provide an amplified signal;

a processing circuit, wherein the processing circuit is operable to generate a signal output corresponding to the amplified signal, wherein the processing circuit includes a conditional multiplication circuit that is operable to conditionally multiply the signal output by a gain correction signal and to provide a result as an interim output;

a data detector, wherein the data detector is operable to apply a data detection algorithm to the signal output and to provide an ideal output;

an error signal calculation circuit, wherein the error signal calculation circuit is operable to generate a gain correction signal based at least in part on the interim output and a derivative of the ideal output; and wherein a level of amplification by the variable gain amplifier is based at least in part on the gain correction signal.

2. The data processing system of claim 1, wherein the conditional multiplication circuit is operable to provide the signal output as the interim output after a delay period, and wherein the conditional multiplication circuit is operable to provide the product of multiplying the signal output by the gain correction signal as the interim output prior to expiration of the delay period.

3. The data processing system of claim 2, wherein the delay period corresponds approximately to a propagation delay of the amplified signal to the error signal calculation circuit.

4. The data processing system of claim 2, wherein the delay period imposed by the delay circuit corresponds approximately to a propagation delay of the amplified signal to the error signal calculation circuit.

5. The processing system of claim 1, wherein the conditional multiplication circuit includes:
   a delay circuit and an inverse function circuit, wherein the inverse function circuit is operable to provide an inverse of the gain correction signal, and wherein the combination of the delay circuit and the inverse function circuit is operable to provide a delayed inverse of the gain correction signal;
   a first multiplier circuit operable to multiply the gain correction signal by the delayed inverse of the gain correction signal to yield a product; and
   a second multiplier circuit operable to multiply the product by the signal output to yield the interim output.

6. The data processing system of claim 1, wherein the error calculation circuit includes a summation element, and wherein the summation element is operable to subtract a derivative of the ideal output from the interim output to yield an error signal corresponding to the gain correction signal.

7. The data processing system of claim 1, wherein the signal output is a first signal output, and wherein the processing circuit further includes:
   an analog to digital converter, wherein the analog to digital converter is operable to convert the amplified signal to a series of digital samples;
   a digital filter, wherein the digital filter is operable to filter the series of digital samples to yield a second signal output; and
   a delay circuit, wherein the delay circuit is operable to delay the second signal output by a delay period to yield the first signal output.

8. The data processing system of claim 7, wherein the system further comprises:
   a partial response target filter, wherein the partial response target filter is operable to receive the ideal output and to provide the derivative of the ideal output.

9. The data processing circuit of claim 8, wherein the delay period corresponds approximately to a propagation delay of the first signal output to the derivative of the ideal output, less the propagation delay through the conditional multiplication circuit.

10. The processing system of claim 9, wherein the delay circuit is a first delay circuit, wherein the delay period is a first delay period, and wherein the conditional multiplication circuit includes:
    a second delay circuit and an inverse function circuit, wherein the inverse function circuit is operable to provide an inverse of the gain correction signal, wherein the combination of the second delay circuit and the inverse function circuit is operable to provide a delayed inverse of the gain correction signal, and wherein a second delay period imposed by the second delay circuit corresponds approximately to a propagation delay of the amplified signal to the error signal calculation circuit;
    a first multiplier circuit operable to multiply the gain correction signal by the delayed inverse of the gain correction signal to yield a product; and
    a second multiplier circuit operable to multiply the product by the signal output to yield the interim output.

11. The data processing of claim 1, wherein the derivative of the ideal output is the ideal output.

12. The data processing system of claim 1, wherein the data processing system is implemented as part of a storage device.

13. The data processing system of claim 12, wherein the storage device is a hard disk drive.

14. The data processing system of claim 1, wherein the data processing system is implemented as an integrated circuit.

15. A method for reduced latency data processing, the method comprising:
    providing a variable gain amplifier;
    amplifying a data input signal using the variable gain amplifier to provide an amplified signal;
    processing the amplified signal to create a processed signal;
    conditionally multiplying the processed signal by a gain correction signal to yield an interim signal;
    performing a data detection on the processed signal to create an ideal output;
    calculating a difference between the interim signal and the ideal output;
    generating the gain correction signal based at least in part on the difference; and
    adjusting an amplification level of the variable gain amplifier based at least in part on the gain correction signal.

16. The method of claim 15, wherein processing the amplified signal includes:
    converting the amplified signal to a digital amplified signal.

17. The method of claim 16, wherein processing the amplified signal further includes:
    digitally filtering the digital amplified signal to generate the processed signal.

18. The method of claim 15, wherein performing the data detection on the processed signal includes:
    applying a data detection algorithm to the processed signal to yield a detected output; and
    performing a partial target response filtering on the detected output to yield the ideal output.

19. The method of claim 15, wherein conditionally multiplying the processed signal by the gain correction signal yields the following interim signal:
    for a period before the gain correction signal has been applied to a subsequent data input signal, multiplying the processed signal by the gain correction signal to yield the interim signal; and for a period after the gain correction signal has been applied to a subsequent data input signal, providing the processed signal as the interim signal.

20. The method of claim 15, wherein conditionally multiplying the processed signal by the gain correction signal yields the following interim signal:
  for a first period after the gain correction signal is generated and before a delay point, multiplying the processed signal by the gain correction signal to yield the interim signal; and
  for a period after the delay point, providing the processed signal as the interim signal.

21. The method of claim 15, wherein conditionally multiplying the processed signal by the gain correction signal yields the following interim signal:
  for a first period, multiplying the processed signal by the gain correction signal to yield the interim signal, wherein the first period corresponds approximately to the time delay between generation of the gain correction signal to propagation of the gain correction signal into the difference; and
  for a second period, providing the processed signal as the interim signal, wherein the second period is after the first period.

22. The method of claim 21, wherein the second period continues from the end of the first period to generation of a subsequent gain correction signal.

23. A storage device, the storage device comprising:
  a storage medium;
  a read/write head assembly disposed in relation to the storage medium;
  a variable gain amplifier operable to receive a data input signal from the read/write head assembly, and to amplify the data input signal to provide an amplified signal;
  a processing circuit, wherein the processing circuit is operable to generate a signal output corresponding to the amplified signal, wherein the processing circuit includes a conditional multiplication circuit that is operable to conditionally multiply the signal output by a gain correction signal and to provide the result as an interim output;
  a data detector, wherein the data detector is operable to apply a data detection algorithm to the signal output and to provide an ideal output;
  an error signal calculation circuit, wherein the error signal calculation circuit is operable to generate a gain correction signal based at least in part on the interim output and a derivative of the ideal output; and
  wherein a level of amplification by the variable gain amplifier is based at least in part on the gain correction signal.

* * * * *